(12) United States Patent
Basu et al.

(10) Patent No.: US 10,459,034 B2
(45) Date of Patent: Oct. 29, 2019

(54) METHOD AND APPARATUS FOR ESTIMATING STATE OF HEALTH (SOH) OF BATTERY

(71) Applicant: Samsung Electronics Co., Ltd., Suwon-si (KR)

(72) Inventors: Suman Basu, Bangalore (IN); Krishnan S Hariharan, Bangalore (IN); Taejun Yeo, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 262 days.

(21) Appl. No.: 14/757,540

(22) Filed: Dec. 23, 2015

(65) Prior Publication Data

US 2016/0187428 A1 Jun. 30, 2016

(30) Foreign Application Priority Data

Dec. 26, 2014 (IN) ............................ 6611/CHE/2014
Oct. 27, 2015 (KR) ........................ 10-2015-0149719

(51) Int. Cl.
*G01R 31/392* (2019.01)
*G01R 31/367* (2019.01)

(52) U.S. Cl.
CPC ......... *G01R 31/367* (2019.01); *G01R 31/392* (2019.01)

(58) Field of Classification Search
CPC .................... G01R 31/3651; G01R 31/3679
See application file for complete search history.

(56) References Cited

U.S. PATENT DOCUMENTS

| 5,977,750 | A | 11/1999 | Ng et al. |
| 6,411,911 | B1* | 6/2002 | Hirsch ................ G01R 31/362 |
| | | | 702/117 |
| 2009/0140744 | A1 | 6/2009 | Iwane et al. |
| 2009/0228225 | A1* | 9/2009 | Burgess ............. G01R 31/3651 |
| | | | 702/63 |
| 2012/0022816 | A1* | 1/2012 | Zenati ................ G01R 31/3624 |
| | | | 702/63 |
| 2012/0296586 | A1* | 11/2012 | Kirchev ............. G01R 31/3679 |
| | | | 702/63 |
| 2016/0003917 | A1* | 1/2016 | You ..................... G01R 31/3679 |
| | | | 702/63 |

FOREIGN PATENT DOCUMENTS

| KR | 10-2010-0004024 A | 1/2010 |
| KR | 10-2013-0039684 A | 4/2013 |
| KR | 10-1283301 B1 | 7/2013 |
| KR | 10-2013-0134397 A | 12/2013 |
| KR | 10-1488828 B1 | 2/2015 |

* cited by examiner

*Primary Examiner* — Khamdan N. Alrobaie
(74) *Attorney, Agent, or Firm* — NSIP Law

(57) ABSTRACT

A method and apparatus for estimating a state of health (SOH) of a battery are provided. The method includes measuring a voltage and a partial discharge time of the battery, acquiring a normalized partial discharge time using a battery model of a reference battery normalized with respect to a time, calculating a full discharge time of the battery based on the partial discharge time and the normalized partial discharge time, and estimating the SOH based on a ratio between a stored full discharge time of the reference battery and the full discharge time of the battery.

14 Claims, 7 Drawing Sheets

METHOD AND APPARATUS FOR ESTIMATING STATE OF HEALTH (SOH) OF BATTERY

CROSS-REFERENCE TO RELATED APPLICATION(S)

This application claims the benefit under Indian Patent Application No. 6611/CHE/2014, filed on Dec. 26, 2014, in the Intellectual Property INDIA, and Korean Patent Application No. 10-2015-0149719, filed on Oct. 27, 2015, in the Korean Intellectual Property Office, the entire disclosures of which are incorporated herein by reference for all purposes.

BACKGROUND

1. Field

The following description relates to a method of estimating a state of health (SOH) of a battery, and more particularly to a method and system for estimating an SOH of a battery based on a partial discharge time or a partial charge time of the battery.

2. Description of Related Art

Generally, batteries are widely used as rechargeable energy storage devices used for a variety of applications due to a relatively high energy, a power density and a relatively low cost, in comparison to other energy storage devices. Energy storage capacities of all batteries decrease when the batteries are used, due to inherent chemical reactions. A state of health (SOH) of a battery is a very important parameter to measure a quality of the battery, and indicates an available chemical component of the battery. The SOH of the battery defines a performance of the battery based on a current battery state and a state of a new battery. Due to aging or an end of a life of the battery, the performance may decrease from the original state and the SOH of the battery changes. SOH estimation methods have been developed to predict a remaining life of a chemical action of a rechargeable battery.

Existing methods of estimating an SOH of a battery typically relate to a measurement of a remaining capacity. Because the above methods involve fully charging or fully discharging of a battery at a constant current or a predetermined voltage, a relatively long period of time is required.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided a method of estimating a state of health (SOH) of a battery, the method including measuring a voltage and a partial discharge time of the battery, acquiring a normalized partial discharge time using a battery model normalized with respect to a time, calculating a full discharge time of the battery based on the partial discharge time and the normalized partial discharge time, and estimating the SOH based on a ratio between a stored full discharge time of a reference battery and the full discharge time of the battery.

The battery model may be a graph showing a change in a discharge voltage of the reference battery over time.

The acquiring of the normalized partial discharge time may include normalizing the battery model of the reference battery with respect to the time.

The measuring of the voltage and the partial discharge time may include measuring a first voltage of the battery at a first time and measuring a second voltage of the battery at a second time. An interval between the first time and the second time may correspond to the partial discharge time.

The acquiring of the normalized partial discharge time may include acquiring a first normalized time corresponding to the first voltage and a second normalized time corresponding to the second voltage from the normalized battery model. An interval between the first normalized time and the second normalized time may correspond to the normalized partial discharge time.

The calculating of the full discharge time may include calculating the full discharge time of the battery based on a ratio between the partial discharge time and the normalized partial discharge time.

The method may further include predicting a loss of a cathode active material and estimating a capacity of the battery.

In accordance with another embodiment, there is provided an apparatus for estimating an SOH of a battery, the apparatus including a measurer configured to measure a voltage and a partial discharge time of the battery, and a processor configured to acquire a normalized partial discharge time using a battery model normalized with respect to a time, to calculate a full discharge time of the battery based on the partial discharge time and the normalized partial discharge time, and to estimate the SOH based on a ratio between a stored full discharge time of a reference battery and the full discharge time of the battery.

The battery model may be a graph showing a change in a discharge voltage of the reference battery over time.

The processor may be configured to normalize the battery model of the reference battery with respect to the time.

The measurer may be configured to measure a first voltage of the battery at a first time and measure a second voltage of the battery at a second time. An interval between the first time and the second time may correspond to the partial discharge time.

The processor may be configured to acquire a first normalized time corresponding to the first voltage and a second normalized time corresponding to the second voltage from the normalized battery model.

An interval between the first normalized time and the second normalized time may correspond to the normalized partial discharge time.

The processor may be configured to calculate the full discharge time of the battery based on a ratio between the partial discharge time and the normalized partial discharge time.

The processor may be configured to predict a loss of a cathode active material and to estimate a capacity of the battery.

In accordance with another embodiment, there is provided a method of estimating an SOH of a battery, the method including measuring a voltage and a partial charge time of the battery, acquiring a normalized partial charge time using a battery model normalized with respect to a time, calculating a full charge time of the battery based on the partial charge time and the normalized partial charge time, and estimating the SOH based on a ratio between a stored full charge time of a reference battery and the full charge time of the battery. The battery model may be a graph showing a change in a charging voltage of the reference battery over time.

The measuring of the voltage and the partial charge time may include measuring a first voltage of the battery at a first time and measuring a second voltage of the battery at a second time. An interval between the first time and the second time may correspond to the partial charge time.

The acquiring of the normalized partial charge time may include acquiring a first normalized time corresponding to the first voltage and a second normalized time corresponding to the second voltage from the normalized battery model. An interval between the first normalized time and the second normalized time may correspond to the normalized partial charge time.

The calculating of the full charge time may include calculating the full charge time of the battery based on a ratio between the partial charge time and the normalized partial charge time.

Other features and aspects will be apparent from the following detailed description, the drawings, and the claims.

Figure 1:
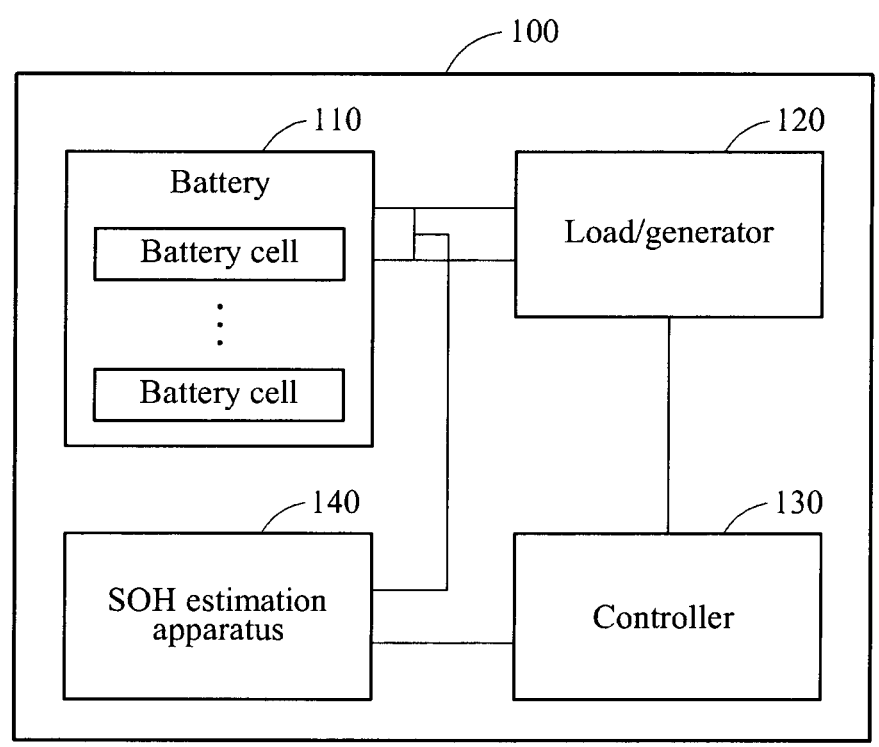
FIG. 1 is a block diagram illustrating an example of a system for estimating a state of health (SOH) of a battery connected to a load in accordance with an embodiment.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, some embodiments will be described in detail with reference to the accompanying drawings. The scope of the present disclosure, however, should not be construed as limited to the embodiments set forth herein. Like reference numerals in the drawings refer to like elements throughout the present disclosure.

Various modifications may be made to the embodiments. However, it should be understood that these embodiments are not construed as limited to the illustrated forms and include all changes, equivalents or alternatives within the idea and the technical scope of this disclosure.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "include" and/or "have," when used in this specification, specify the presence of stated features, integers, steps, operations, elements, components or combinations thereof, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

FIG. 1 is a block diagram illustrating a system 100 for estimating a state of health (SOH) of a battery 110 connected to a load or generator (load/generator) 120 in accordance with an embodiment.

Referring to FIG. 1, the system 100 includes the battery 110, the load/generator 120, a controller 130 and an apparatus 140 for estimating an SOH of a battery. Hereinafter, an apparatus for estimating an SOH of a battery is referred to as an "SOH estimation apparatus." The battery 110 provides electric energy to supply power to a load, and is charged with electric energy based on power generated by a generator. The load is, for example, an electronic device, however, there is no limitation thereto. To supply power to the load, the battery 110 includes at least one electrochemical cell to store chemical energy converted to electric energy. For example, when the battery 110 includes a plurality of battery cells, the battery cells are connected to each other in series or in parallel.

The controller 130 controls the load/generator 120 and the SOH estimation apparatus 140. The controller 130 periodically measures power of the battery 110 and outputs a value of the measured power to the load. The power is measured during charging or discharging of the battery 110. A voltage of the battery 110 has a value between a final discharge voltage value and a maximum charge voltage value.

Also, the controller 130 stores a control instruction and operation to control an operation of each of the SOH estimation apparatus 140 and the load/generator 120. For example, the controller 130 determines torque information of an electric vehicle (EV), and controls an output of a motor to meet the torque information based on information about, for example, an accelerator, a brake or a speed. The controller 130 transmits a control signal to the load/generator 120 and controls charging or discharging of the battery 110 based on an estimated SOH.

The battery 110 is a rechargeable battery with a chemical composition that enables recharging. The battery 110 includes, but is not limited to, for example, a lithium (Li)-ion battery, a Li-ion polymer battery, a nickel-cadmium (NiCd) battery, a nickel-hydrogen ($NiH_2$) battery, a Li-ion battery with a nickel-based cathode, a nickel cobalt aluminum (NCA) battery, and a nickel-zinc (NiZn) battery.

The electronic device includes, but is not limited to, for example, an EV, a laptop, a mobile phone, a personal digital assistant (PDA), a tablet device, an electronic book, a video camera, a portable personal computer (PC) and a portable media player.

The SOH estimation apparatus 140 monitors a first voltage corresponding to a first time during charging or discharging of the battery 110. Also, the SOH estimation apparatus 140 monitors a second voltage corresponding to a second time during the charging or discharging of the battery 110.

When the first voltage and the second voltage are monitored, the SOH estimation apparatus 140 acquires an interval between the first time and the second time. The interval between the first time and the second time corresponds to, for example, a partial discharge time.

The SOH estimation apparatus 140 normalizes a battery model of the battery 110 with respect to a time. The battery model includes, for example, a graph that shows a change in a voltage over time and that indicates a change in a charge state or a discharge state of a new battery corresponding to the battery 110 over time. The normalized battery model describes a unique characteristic of the battery 110. In other words, the normalized battery model has a uniform voltage based on a normalized time regardless of a degree of degradation in a battery.

When the battery model is normalized with respect to the time, the SOH estimation apparatus 140 acquires a first normalized time corresponding to the first voltage and a second normalized time corresponding to the second voltage. The battery model includes, for example, a time-voltage graph showing a change in a voltage of a battery over time.

When the first normalized time and the second normalized time are measured (*acquired, the SOH estimation apparatus 140 measures an interval between the first normalized time and the second normalized time. The interval between the first normalized time and the second normalized time corresponds to, for example, a normalized partial discharge time.

The SOH estimation apparatus 140 calculates a full discharge time of the battery 110 based on a ratio between the partial discharge time and the normalized partial discharge time.

When the full discharge time of the battery 110 is calculated, the SOH estimation apparatus 140 estimates the SOH of the battery 110 based on a ratio between the calculated full discharge time and a full discharge time of a fully charged battery. The full discharge time of the battery 110 is acquired from a manufacturer. The full discharge time refers to a period of time required until a power of a fully charged battery is fully discharged.

The system 100 allows a user interface (not shown) to display an amount of energy remaining in the battery 110 and the SOH of the battery 110 so that a user determines an operating mode. Thus, it is possible to enhance a user experience.

FIG. 1 illustrates a limited block diagram of the system 100, however, there is no limitation thereto. For example, the system 100 may include a plurality of communicators configured to communicate with the other components in the system 100.

Figure 2:
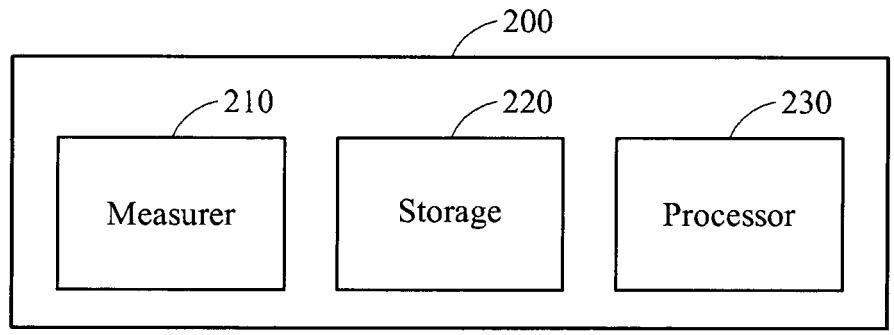
FIG. 2 is a block diagram illustrating an example of an apparatus for estimating an SOH of a battery in accordance with an embodiment.

FIG. 2 is a block diagram illustrating an example of an SOH estimation apparatus 200 in accordance with an embodiment.

Referring to FIG. 2, the SOH estimation apparatus 200 includes a measurer 210, a storage 220 and a processor 230.

The measurer 210 measures a voltage and a partial discharge time of a battery. Also, the measurer 210 measures the voltage and a partial charge time of the battery.

The measurer 210 measures an open-circuit voltage of the battery when the battery is being connected to an electronic device or a vehicle. The measurer 210 records a point in time at which the voltage of the battery is measured. In an example, when a discharge voltage is measured, an interval between an initial voltage measurement time and a final voltage measurement time corresponds to a partial discharge time. When a charge voltage is measured, the interval between the initial voltage measurement time and the final voltage measurement time corresponds to a partial charge time.

The measurer 210 acquires a first voltage at a first time and a second voltage at a second time. An interval between the first time and the second time corresponds to, for example, a partial discharge time or a partial charge time.

The storage 220 stores a battery model of the battery. The battery model includes, for example, a graph showing a change in a voltage over time during charging or discharging of the battery. Also, the battery model includes, for example, a battery model of a new battery corresponding to a battery that is in use, and a graph showing a change in a voltage over time until a power of a battery that is in use and that is fully charged is fully discharged.

The storage 220 stores a period of time in which a power of a fully charged new battery is fully discharged. In embodiments, a period of time in which a power of a fully charged battery is fully discharged is referred to as a full discharge time. The full discharge time of the new battery is acquired from a manufacturer.

The processor 230 calculates a full discharge time of the battery using a normalized battery model, and estimates an SOH of the battery based on a ratio between the full discharge time of the new battery and a full discharge time of the battery. The new battery is used as a reference battery.

The processor 230 normalizes the battery model stored in the storage 220 with respect to a time. The battery model includes, for example, a graph showing a change in a voltage over time during charging or discharging of the new battery.

Figure 5:
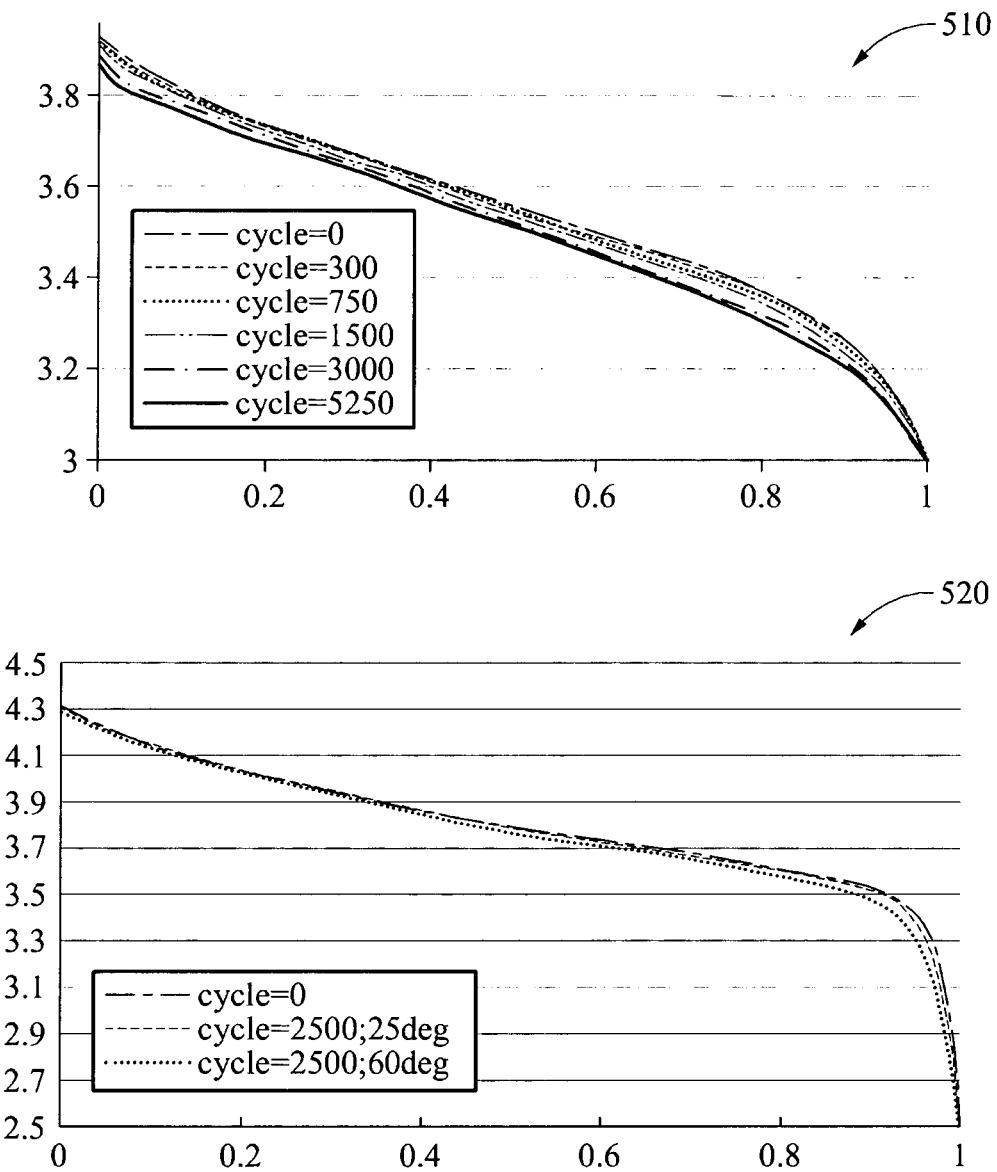
FIG. 5 is a graph illustrating examples of a normalized battery model of a battery based on various discharge cycles in accordance with an embodiment.

In embodiments, a battery model normalized with respect to a time is referred to as a normalized battery model. An example of the normalized battery model is shown in FIG. 5.

The processor 230 acquires a first normalized time corresponding to the first voltage and a second normalized time corresponding to the second voltage from the normalized battery model. An interval between the first normalized time and the second normalized time corresponds to, for example, a normalized partial discharge time.

The processor 230 acquires a full discharge time of the battery based on a ratio between the partial discharge time and the normalized partial discharge time, which will be further described with reference to FIG. 8.

The processor 230 predicts a loss of a cathode active material and estimates a capacity of the battery.

Figure 3:
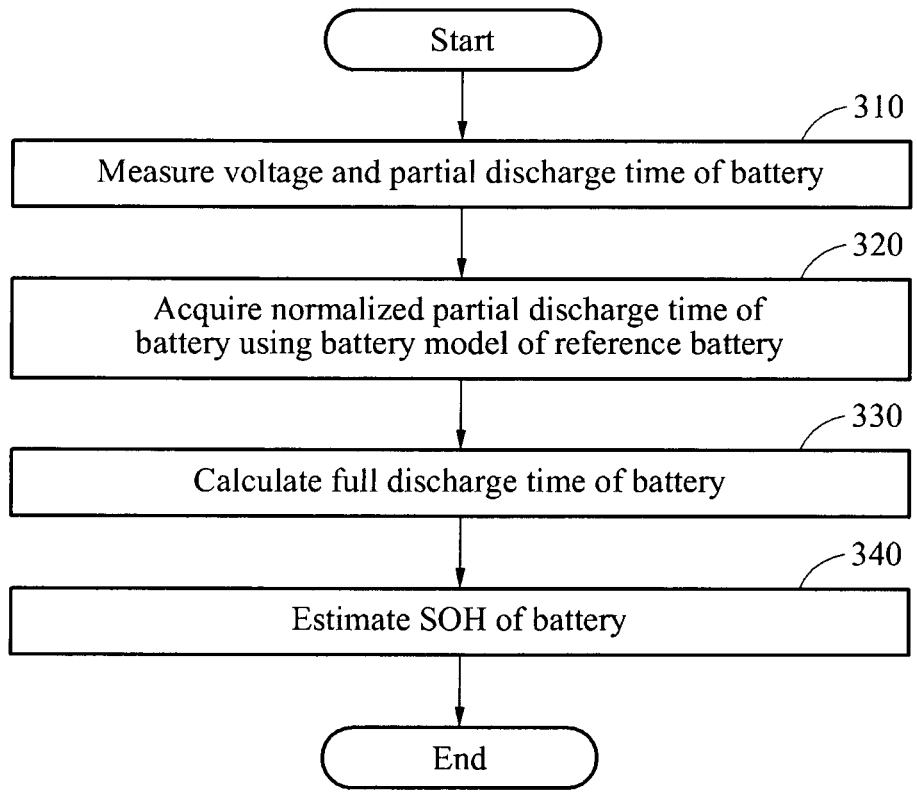
FIG. 3 is a flowchart illustrating an example of a method of estimating an SOH of a battery in accordance with an embodiment.

FIG. 3 illustrates an example of a method of estimating an SOH of a battery in accordance with an embodiment. However, operations 310 through 340 of FIG. 3 do not need to be accurately performed in a given order, and a slight change in operations 310 through 340 is allowed. Operations 310 through 340 are performed by, for example, the SOH estimation apparatus 140 of FIG. 1, a microcontroller, a microprocessor or other non-transitory computer-readable storage media.

Referring to FIG. 3, in operation 310, an SOH estimation apparatus measures a voltage and a partial discharge time of a battery. The measuring of the voltage during discharging of the battery in the example of FIG. 3 is merely an example, and accordingly the method of FIG. 3 is applicable to charging of the battery.

The SOH estimation apparatus measures a first voltage at a first time and a second voltage at a second time.

The first time refers to a point in time at which an arbitrary first voltage (*the first voltage is measured. The first time is, for example, a point in time at which charging or discharging of the battery is started. An initial voltage of a battery in an electronic device in response to the electronic device operating is the first voltage.

The second time refers to a point in time at which an arbitrary second voltage (*the second voltage is measured. While an electronic device including a battery operates, one of times other than the first time is the second time. However, to acquire an exact result, an interval between the first time and the second time needs to correspond to a difference between the first voltage and the second voltage. The second time is, for example, a point in time at which charging or discharging of the battery is terminated. Accordingly, a voltage of the battery immediately after an operation of the battery is terminated is the second voltage.

The interval between the first time and the second time corresponds to, for example, a partial discharge time. The SOH estimation apparatus measures the voltage of the battery including the first voltage and the second voltage, and acquires a partial discharge voltage corresponding to the interval between the first time and the second time.

In operation 320, the SOH estimation apparatus acquires a normalized partial discharge time of the battery.

The SOH estimation apparatus acquires the normalized partial discharge time using a battery model of a reference battery normalized with respect to a time.

The SOH estimation apparatus normalizes, with respect to the time, a graph showing a change in a voltage over the time during charging or discharging of the reference battery. The graph is stored in advance. The reference battery includes, for example, a new battery that is fully charged. The SOH estimation apparatus extracts a normalized voltage curve from the normalized battery model.

The SOH estimation apparatus acquires a first normalized time corresponding to the first voltage and a second normalized time corresponding to the second voltage from the normalized battery model. The SOH estimation apparatus acquires the first normalized time corresponding to the first voltage measured in operation 310 from the normalized battery model. Also, the SOH estimation apparatus acquires the second normalized time corresponding to the second voltage measured in operation 310 from the normalized battery model. An interval between the first normalized time and the second normalized time corresponds to, for example, the normalized partial discharge time.

In operation 330, the SOH estimation apparatus calculates a full discharge time of the battery. The full discharge time is a period of time required until a power of a fully charged battery is fully discharged.

The SOH estimation apparatus calculates the full discharge time based on a ratio between the partial discharge time and the normalized partial discharge time.

In operation 340, the SOH estimation apparatus estimates an SOH of the battery.

The SOH estimation apparatus estimates the SOH of the battery based on a ratio between the full discharge time of the battery and a full discharge time of a new battery that is fully charged. The full discharge time of the new battery is stored in advance.

Figure 4:
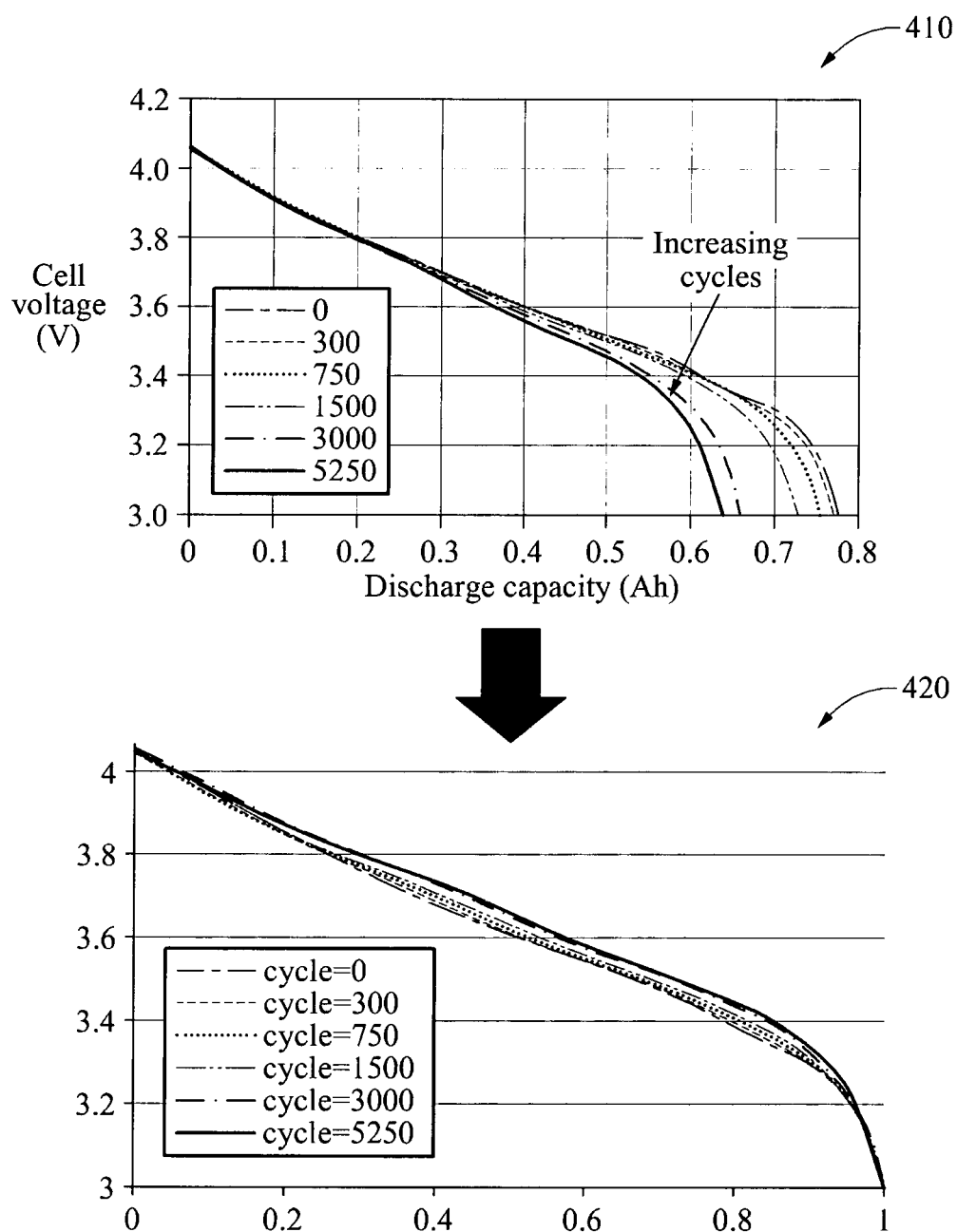
FIG. 4 is a graph illustrating an example of a battery model and a normalized battery model in accordance with an embodiment.

FIG. 4 illustrates an example of a battery model and an example of a battery model normalized with respect to a discharge capacity in accordance with an embodiment.

FIG. 4 illustrates a graph showing a battery model 410 based on various discharge cycles at 50° C., and a graph showing a battery model 420 normalized with respect to a discharge capacity, based on various discharge cycles.

Referring to the graph showing the battery model 410, it is found that the discharge capacity decreases when a number of discharge cycles increases. For example, a fully charged new battery has a discharge capacity close to "0.8" ampere-hour (Ah), whereas a discharge capacity of a battery that is repeatedly charged and discharged 3000 times does not reach "0.7" Ah.

Referring to the graph showing the battery model 420, it is found that almost the same integral value is maintained regardless of the discharge cycles of the battery.

FIG. 5 illustrates examples of a normalized battery model of a battery based on various discharge cycles in accordance with an embodiment.

FIG. 5 illustrates a normalized battery model 510 of a nickel oxide (NiO) battery based on various discharge cycles at −10° C., and a normalized battery model 520 of an NCA battery at a room temperature and a relatively high temperature.

The normalized battery model 510 is normalized with respect to a time and represents a unique characteristic of the NiO battery. As shown in a graph of the is normalized battery model 510, an integral value of the normalized battery model 510 remains unchanged regardless of the discharge cycles, even at a relatively low temperature.

As shown in a graph of the normalized battery model 520, an integral value of the normalized battery model 520 remains unchanged regardless of a temperature and the discharge cycles.

A capacity of a battery is represented as shown in Equation 1 below.

$$\text{Cell capacity} = \int_0^{t_p} V_{cell} I_{cell} dt \quad \text{[Equation 1]}$$

$$= I_{cell} t_p \int_0^1 V_{cell} dt^*$$

Where, $$t^* = \frac{t}{t_p}$$

In Equation 1, $V_{cell}$ denotes a voltage of the battery, $I_{cell}$ denotes a current of the battery, $t_p$ denotes a full discharge time of the battery, and $t^*$ denotes a normalized discharge time of the battery. The normalized discharge time $t^*$ is obtained by dividing a time $t$ by the full discharge time $t_p$. Because a battery model normalized with respect to a time remains unchanged regardless of discharge cycles, a normalized time integration of the voltage $V_{cell}$ is represented by a constant K which is represented by Equation 2 shown below.

$$\text{If,} \int_0^1 V_{cell} dt^* = K \rightarrow \text{Cell capacity} = (I_{cell} K) t_p \quad \text{[Equation 2]}$$

In Equation 2, K denotes a unique value associated with the battery and is maintained in a margin of error of 1.5% regardless of a temperature. Accordingly, the normalized battery model has the constant K regardless of the discharge cycles, which is used to calculate the capacity of the battery.

Figure 6:
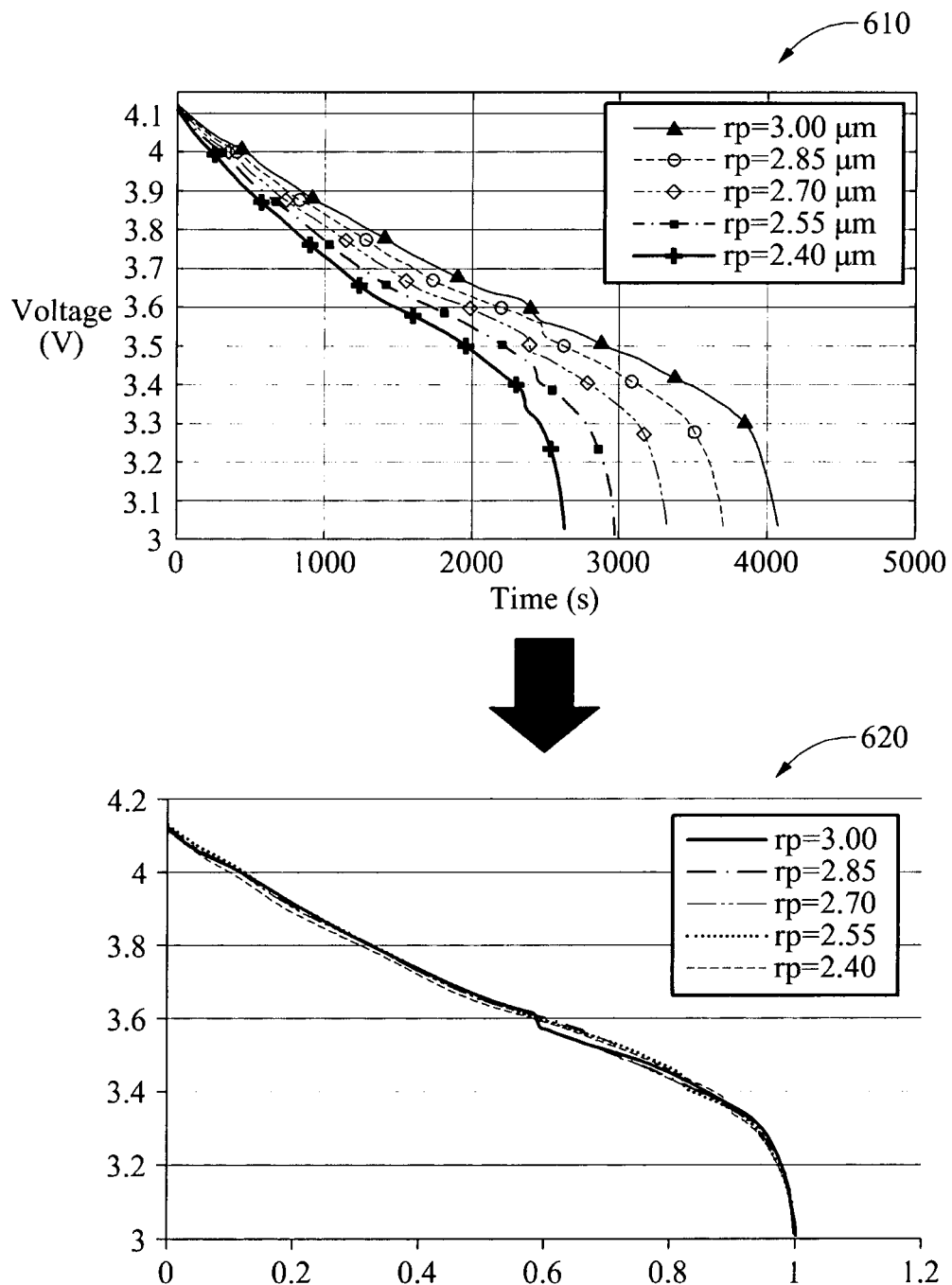
FIG. 6 is a graph illustrating an example of a normalized battery model of a battery based on a particle size when a charge rate (C-rate) is set to a 2C-rate in accordance with an embodiment.

FIG. 6 illustrates an example of a normalized battery model of a battery based on a particle size when a charge rate (C-rate) is set to a 2C-rate in accordance with an embodiment.

FIG. 6 illustrates a graph showing a battery model 610 based on cathode particle sizes at the 2C-rate, and a graph showing a battery model 620 normalized with respect to a time based on cathode particle sizes.

Referring to the graph showing the battery model 610, it is found that when a cathode particle diameter decreases, a rate of a reduction in a voltage during discharging increases, which indicates a reduction in an SOH of the battery. In the battery model 610, diameter measurement is performed when a cathode particle diameter is set to 3 micrometers (μm), 2.85 μm, 2.70 μm, 2.55 μm and 2.40 μm. When a number of discharge cycles of the battery increases, the cathode particle diameter decreases, which is associated with a total discharge capacity of the battery.

Referring to the graph showing the battery model 620, it is found that a curve indicating a voltage has the same integral value regardless of the cathode particle diameter. In embodiments, normalizing of a battery model with respect to a time indicates setting an axis representing the time to "1" by dividing a discharge voltage curve in the battery model by a full discharge time corresponding to the discharge voltage curve in a graph showing the battery model.

Figure 7:
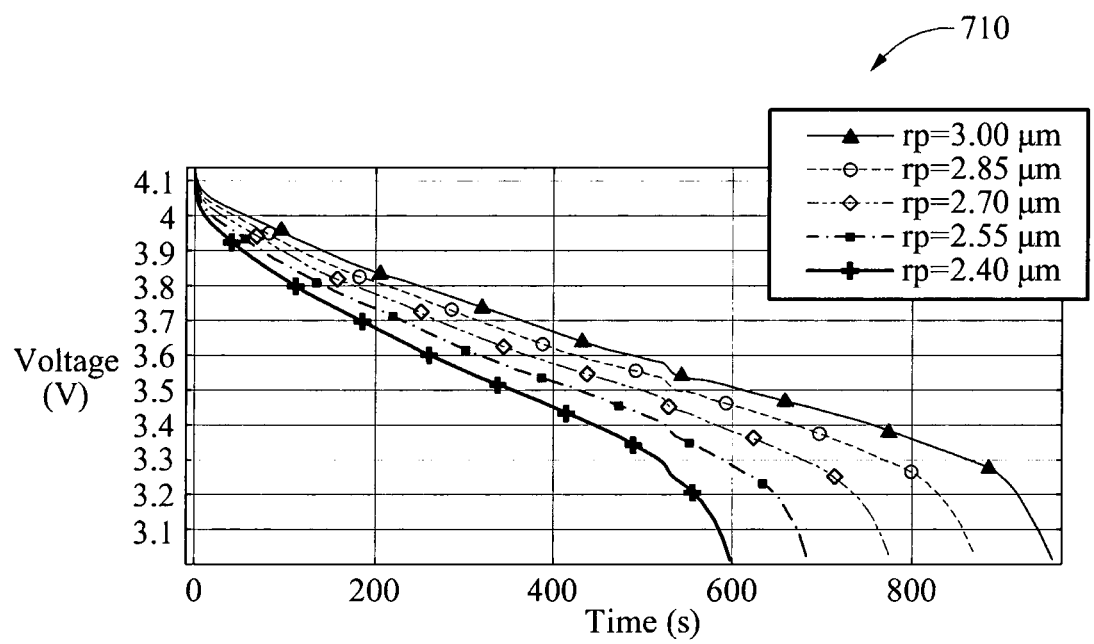
FIG. 7 is a graph illustrating an example of a normalized battery model of a battery based on a particle size at a 4C-rate in accordance with an embodiment.
Figure 7:
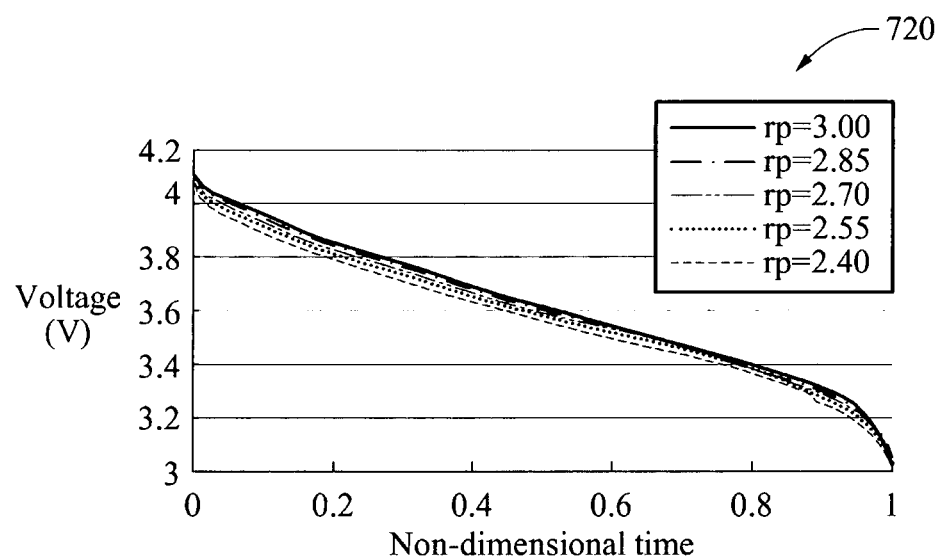

FIG. 7 illustrates examples of a normalized battery model of a battery based on a particle size at a 4C-rate in accordance with an embodiment.

FIG. 7 illustrates a graph showing a battery model 710 based on various particle sizes at the 4C-rate, and a graph showing a battery model 720 normalized with respect to a time based on various particle sizes.

In FIG. 7, at the 4C-rate, the battery model 720 also has the same integral value regardless of a discharge cycle. Thus, it is possible to estimate an SOH of a battery regardless of a temperature and a C-rate in all circumstances. Also, because only information about a discharge voltage and a discharge time of a battery is required, the SOH may also be estimated while an electronic device and an EV are moving.

Table 1 shows values of the constant K at various C-rates.

TABLE 1

| c-rate | K average | Σ K, normalized | Max error(%) |
|---|---|---|---|
| 1 | 3.659879 | 0.00059 | 0.1791 |
| 2 | 3.638012 | 0.001933 | 0.5688 |
| 4 | 3.595379 | 0.004476 | 1.2889 |

In Table 1, when the C-rate increases, the constant K decreases and a maximum error rate increases. However, the maximum error rate does not exceed 1.5% despite an increase in the C-rate.

Figure 8:
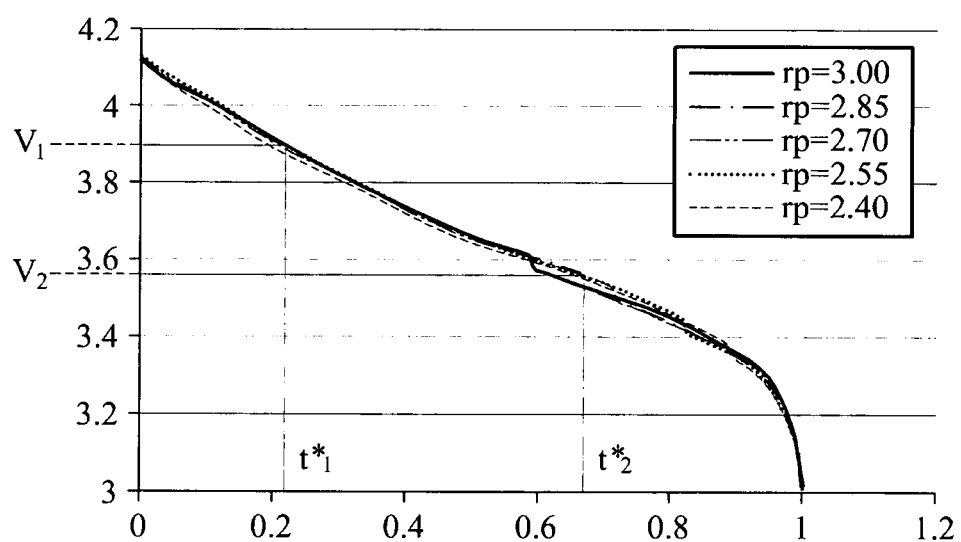
FIG. 8 is a graph illustrating an example of a method of estimating a capacity of a battery based on a normalized battery model of a battery in accordance with an embodiment.

FIG. 8 illustrates an example of a method of estimating a capacity of a battery based on a normalized battery model of a battery in accordance with an embodiment.

A scheme of acquiring a first normalized time $t^*_1$ and a second normalized time $t^*_2$ from a battery model normalized with respect to a time based on various particle sizes is described with reference to FIG. 8.

An SOH estimation apparatus in accordance with an embodiment measures a first voltage $V_1$ at a first time $t_1$ and a second voltage $V_2$ at a second time $t_2$.

The SOH estimation apparatus acquires the first normalized time $t^*_1$ corresponding to the first voltage $V_1$ and a second normalized time $t^*_2$ corresponding to the second voltage $V_2$ from the normalized battery model.

The normalized battery model is represented by Equation 3 shown below.

$$\frac{\Delta t}{t_p} = \Delta t^* = t^*_2(V_2) - t^*_1(V_1) \rightarrow t_p = \frac{\Delta t}{\Delta t^*(V_2, V_1)} \quad \text{[Equation 3]}$$

In Equation 3, $\Delta t$ denotes a partial discharge time, and $\Delta t^*$ denotes a normalized partial discharge time. In other words, a full discharge time of a battery is calculated based on a ratio between the partial discharge time and the normalized partial discharge time. An SOH of a battery is calculated using Equation 4 shown below.

$$SOH = \frac{t_p}{t_{p,0}} \quad \text{[Equation 4]}$$

$$= \frac{\text{Capacity}}{\text{Capacity}_0}$$

$$= \left(\frac{r_p}{r_{p,0}}\right)^2$$

$$= \left(\frac{m_{Li,Cathode}}{m_{Li,Cathode,0}}\right)^{\frac{2}{3}} \rightarrow m_{Li,Cathode}$$

$$= m_{Li,Cathode,0} \times \left(\frac{t_p}{t_{p,0}}\right)^{3/2}$$

In Equation 4, $t_{p,0}$ denotes a full discharge time of a reference battery, $t_p$ denotes a full discharge time of a target battery, Capacity denotes a capacity of the target battery, and $\text{Capacity}_0$ denotes a capacity of the reference battery. Also, $r_p$ denotes a diameter of a cathode particle, $m_{Li,Cathode}$ demotes a mass of the cathode particle, and 0 denotes the reference battery. Referring to Equation 4, an SOH of a battery is estimated based on a ratio between a full discharge time of a new battery and a full discharge time of the battery.

The reference battery includes, for example, a new cell or a new battery immediately after manufacture.

Based on the estimated SOH, a capacity of the battery and a mass of the cathode particle are estimated.

As described above, during discharging of a battery, a voltage of the battery is measured and an SOH of the battery is estimated, however, there is no limitation thereto. Accordingly, an SOH of a battery is also estimated during charging the battery.

In an example, an SOH estimation apparatus measures a charging voltage of a battery at a first time and a second time during charging of the battery. In this example, an interval between the first time and the second time corresponds to, for example, a partial charge time.

The SOH estimation apparatus acquires a normalized partial charge time using a battery module normalized with respect to a time. The battery model includes, for example, a graph showing a change in a voltage over time during the charging of the battery. The graph is normalized with respect to the time, and a first normalized time corresponding to a first voltage and a second normalized time corresponding to a second voltage are acquired.

The SOH estimation apparatus calculates a full charge time of the battery based on the partial charge time and the normalized partial charge time. The full charge time is obtained by dividing the normalized partial charge time by the partial charge time.

The SOH estimation apparatus estimates an SOH of the battery based on a ratio between the full charge time of the battery and a full charge time of a reference battery. The full charge time of the reference battery is stored in advance. The reference battery includes, for example, a new battery immediately after manufacture. The full charge time of the reference battery charge time is a period of time required until a state of a new battery changes from a fully discharged state to a fully charged state.

The apparatuses, units, modules, devices, and other components illustrated in FIGS. 1 and 2 that perform the operations described herein with respect to FIG. 3 are implemented by hardware components. Examples of hardware components include controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIG. 3. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of estimating a state of health (SOH) of a battery performed by one or more microprocessors, comprising:
the one or more microprocessors being configured to:
measure a first voltage of the battery at a first time and a second voltage of the battery at a second time, and wherein an interval between the first time and the second time corresponds to a partial discharge time;
acquire a normalized partial discharge time using a battery model normalized with respect to a time;
calculate a full discharge time of the battery based on a ratio between the partial discharge time and the normalized partial discharge time; and
estimate the SOH based on a ratio between a stored full discharge time of a reference battery and the full discharge time of the battery,
wherein the first time is a point in time at which the operation of the battery has started, and the second time is a point in time immediately after the operation of the battery is terminated.

2. The method of claim 1, wherein the battery model is a graph showing a change in a discharge voltage of the reference battery over time.

3. The method of claim 1, wherein the one or more microprocessors are further configured to normalize the battery model of the reference battery with respect to the time.

4. The method of claim 1, wherein the one or more microprocessors are further configured to acquire a first normalized time corresponding to the first voltage and a second normalized time corresponding to the second voltage from the normalized battery model, and wherein an interval between the first normalized time and the second normalized time corresponds to the normalized partial discharge time.

5. The method of claim 1, wherein the one or more microprocessors are further configured to estimate the SOH of a battery regardless of temperature or discharge rate, the battery is connected to an electronic device in operation.

6. A non-transitory computer-readable storage medium storing instructions that, when executed by a processor, cause the processor to perform the method of claim 1.

7. An apparatus for estimating a state of health (SOH) of a battery, the apparatus comprising:
wherein the apparatus for estimating a state of health (SOH) of a battery comprising one or more microprocessors configured to:
measure a first voltage of the battery at a first time and a second voltage of the battery at a second time, and wherein an interval between the first time and the second time corresponds to the partial discharge time;
acquire a normalized partial discharge time using a battery model normalized with respect to a time,
calculate a full discharge time of the battery based on the partial discharge time and the normalized partial discharge time, and
estimate the SOH based on a ratio between a stored full discharge time of a reference battery and the full discharge time of the battery,
wherein the first time is a point in time at which the operation of the battery has started, and the second time is a point in time immediately after the operation of the battery is terminated.

8. The apparatus of claim 7, wherein the battery model is a graph showing a change in a discharge voltage of the reference battery over time.

9. The apparatus of claim 7, wherein the one or more microprocessors are further configured to normalize the battery model of the reference battery with respect to the time.

10. The apparatus of claim 7, wherein the one or more microprocessors are further configured to acquire a first normalized time corresponding to the first voltage and a second normalized time corresponding to the second voltage from the normalized battery model, and wherein an interval between the first normalized time and the second normalized time corresponds to the normalized partial discharge time.

11. The apparatus of claim 7, wherein the one or more microprocessors are further configured to estimates the SOH of a battery regardless of temperature or discharge rate, the battery is connected to an electronic device in operation.

12. A method of estimating a state of health (SOH) of a battery performed by one or more microprocessors, comprising:
the one or more microprocessors being configured to:
measure a first voltage of the battery at a first time and a second voltage of the battery at a second time, and wherein an interval between the first time and the second time corresponds to a partial charge time of the battery;
acquire a normalized partial charge time using a battery model normalized with respect to a time;
calculate a full charge time of the battery based on the partial charge time and the normalized partial charge time; and
estimate the SOH based on a ratio between a stored full charge time of a reference battery and the full charge time of the battery,
wherein the first time is a point in time at which an arbitrary first voltage is measured, and the second time is a point in time at which an arbitrary second voltage is measured, and
wherein each of the first voltage and the second voltage represents a voltage measured during operation of the battery.

13. The method of claim 12, wherein the battery model is a graph showing a change in a charging voltage of the reference battery over time.

14. The method of claim 12, wherein the one or more microprocessors are further configured to acquire a first normalized time corresponding to the first voltage and a second normalized time corresponding to the second voltage from the normalized battery model, and wherein an interval between the first normalized time and the second normalized time corresponds to the normalized partial charge time.

* * * * *